(12) United States Patent
Tournier et al.

(10) Patent No.: US 9,018,685 B2
(45) Date of Patent: Apr. 28, 2015

(54) SEMICONDUCTOR STRUCTURE FOR AN ELECTRONIC INTERRUPTOR POWER SWITCH

(75) Inventors: Dominique Tournier, Lyons (FR); Pierre Brosselard, Villeurbanne (FR); Florian Chevalier, Saint Etienne (FR)

(73) Assignees: Institut National des Sciences Appliquees de Lyon (FR); Centre National de la Recherche Scientifique (FR)

( * ) Notice: Subject to any disclaimer, the term of this patent is extended or adjusted under 35 U.S.C. 154(b) by 0 days.

(21) Appl. No.: 13/812,744

(22) PCT Filed: Jul. 13, 2011

(86) PCT No.: PCT/FR2011/051683
§ 371 (c)(1),
(2), (4) Date: Jan. 28, 2013

(87) PCT Pub. No.: WO2012/013888
PCT Pub. Date: Feb. 2, 2012

(65) Prior Publication Data
US 2013/0119443 A1 May 16, 2013

(30) Foreign Application Priority Data
Jul. 29, 2010 (FR) ...................................... 10 56285

(51) Int. Cl.
*H01L 27/098* (2006.01)
*H01L 29/739* (2006.01)
(Continued)

(52) U.S. Cl.
CPC ......... *H01L 29/8124* (2013.01); *H01L 29/0615* (2013.01); *H01L 29/0619* (2013.01); *H01L 29/0661* (2013.01); *H01L 29/0696* (2013.01);
(Continued)

(58) Field of Classification Search
CPC . H01L 29/739; H01L 21/329; H01L 21/8232; H01L 29/872; H01L 27/098; H01L 21/80; H01L 23/62
See application file for complete search history.

(56) References Cited

U.S. PATENT DOCUMENTS

| 6,459,108 B1 | 10/2002 | Bartsch et al. | |
| 2003/0137010 A1* | 7/2003 | Friedrichs et al. | ............ 257/355 |

(Continued)

FOREIGN PATENT DOCUMENTS

DE 19900169 A1 7/1999

OTHER PUBLICATIONS

International Search Report issued Sep. 8, 2011 re: PCT/FR2011/051683; pp. 2; citing: US 2005/184317 A1 and DE 199 00 169 A1.

*Primary Examiner* — David Vu
*Assistant Examiner* — Mouloucoulaye Inoussa
(74) *Attorney, Agent, or Firm* — Cantor Colburn LLP (57) ABSTRACT

The invention relates to a structure comprising an n-type substrate (1) having a bottom surface (10) and a top surface (11), a drain (D) contacting the bottom surface (10) of the substrate (1), a first n-type semiconductor region (2) having a top surface (21) provided with a contact area (210), a source (S) contacting the contact area (210), and a second p-type semiconductor region (3) arranged inside the first semiconductor region (2) and defining first and second conduction channels (C1, C2) between the drain and the source, characterized in that said structure comprises first and second metal gratings (G1, G2), each of which has a portion (40, 71) contacting the first semiconductor region (2) so as to form a Schottky junction.

15 Claims, 4 Drawing Sheets

(51) Int. Cl.

| | | |
|---|---|---|
| *H01L 29/812* | (2006.01) | |
| *H01L 29/10* | (2006.01) | |
| *H01L 29/808* | (2006.01) | |
| *H01L 27/095* | (2006.01) | |
| *H01L 29/06* | (2006.01) | |
| *H01L 29/16* | (2006.01) | |
| *H01L 29/78* | (2006.01) | |
| *H01L 29/872* | (2006.01) | |

(52) U.S. Cl.
CPC ......... *H01L 29/1066* (2013.01); *H01L 29/1608* (2013.01); *H01L 29/7828* (2013.01); *H01L 29/7832* (2013.01); *H01L 29/8083* (2013.01); *H01L 29/8122* (2013.01); *H01L 29/872* (2013.01); *H01L 27/095* (2013.01)

(56) References Cited

U.S. PATENT DOCUMENTS

2005/0184317 A1* 8/2005 Hatakeyama et al. ........ 257/262
2008/0308838 A1* 12/2008 McNutt et al. ................ 257/133

* cited by examiner

SEMICONDUCTOR STRUCTURE FOR AN ELECTRONIC INTERRUPTOR POWER SWITCH

TECHNICAL FIELD

The invention relates to a semiconducting structure for an electronic power switch as well as to an electronic power switch including a plurality of such semiconducting structures.

BRIEF DESCRIPTION OF RELATED ART

A semiconducting structure of an electronic power switch known from the state of the art, notably from document U.S. Pat. No. 6,459,108, includes:

a substrate of a first type of conductivity, having a lower face and an upper face, a drain electrode in contact with the lower face of the substrate, a first semiconducting region of the first type of conductivity, having a lower surface laid out on the upper face of the substrate, and an upper surface provided with a contact area, a source electrode in contact with the contact area of the first semiconducting region, a second semiconducting region of a second type of conductivity, laid out inside the first semiconducting region, under the contact area so as to delimit a first vertical conduction channel of the first type of conductivity and a second lateral conduction channel of the first type of conductivity between the drain electrode and the source electrode, the first and the second semiconducting region forming a first junction of the p-n type, a third semiconducting region, of the second type of conductivity, laid out on the upper surface of the first semiconducting region and at a distance from the contact area, the first and the third semiconducting region forming a second junction of the p-n type, a gate electrode in contact with the third semiconducting region.

Such a semiconducting structure from the state of the art is a structure of a transistor of the JFET (acronym for Junction Field Effect Transistor) type with which an electronic power switch may be obtained. Subsequently, for the sake of simplicity, the terms of <<drain>>, <<source>> and <<gate>> may respectively be substituted for the expressions of drain electrode, source electrode and gate electrode.

When the bias voltage between the drain and the source, noted as $V_{DS}$, is negative, in particular less than or equal to −3 V, the diode formed by the source, the gate and the second p-n junction provides a parasitic bipolar current altering the electric performances of the semiconducting structure. In this respect, because of the presence of the second p-n junction, the current flowing between the drain and the source, noted as $I_{DS}$, is strongly limited while the current flowing between the gate and the source, noted as $I_{GS}$, is sufficiently great for being able to damage the semiconducting structure.

BRIEF SUMMARY

The present invention aims at finding entirely or partly a remedy to the aforementioned drawbacks and relates to a semiconducting structure for an electronic power switch, including:

a substrate of a first type of conductivity, having a lower face and an upper face, a drain electrode in contact with the lower face of the substrate, a first semiconducting region, of the first type of conductivity, having a lower surface laid out on the upper face of the substrate, and an upper surface provided with a contact area, a source electrode in contact with the contact area of the first semiconducting region, a second semiconducting region, of a second type of conductivity, laid out inside the first semiconducting region, under the contact area, so as to delimit a first and a second conduction channel of the first type of conductivity between the drain electrode and the source electrode, the semiconducting structure being remarkable in that it includes:

a first metal gate electrode having at least one first portion in contact with the second semiconducting region, and at least one second portion in contact with the first semiconducting region so as to form a first junction of the Schottky type, and a second metal gate electrode having at least one first portion in contact with the upper surface of the first semiconducting region so as to form a second junction of the Schottky type, the second gate electrode being laid out at a distance from the contact area.

Thus, such a semiconducting structure according to the invention gives the possibility of doing without a second junction of the p-n type and thereby without a diode providing a parasitic bipolar current when $V_{DS}$ is negative.

The first gate, the source and the first junction of the Schottky type form a first diode of the Schottky type providing a unipolar current of majority carriers allowing, when $V_{DS}$ is negative, reduction of $I_{GS}$ (current flowing between the first gate and the source) in order to protect at best the first gate and the semiconducting structure.

Also, the second gate, the source and the second junction of the Schottky type form a second diode of the Schottky type providing a unipolar current of majority carriers allowing, when $V_{DS}$ is negative, reduction of $I_{GS}$ (current flowing between the second gate and the source) in order to protect at best the second gate and the semiconducting structure.

The aforementioned first and second diodes of the Schottky type moreover allow an increase in $I_{DS}$ in order to improve the performances of the semiconducting structure in terms of electric conduction.

Moreover, such a semiconducting structure includes two gates, instead of a single one, for controlling the power switch, with which it is possible to contemplate an increase in the switching rate of the switch. This increase in the switching rate is possible by the reduction of the charge stored in such a structure because of unipolar conduction.

In an embodiment, the second semiconducting region includes at least one box, of the second type of conductivity, laid out under the second portion of the first gate electrode so as to delimit a first junction of the Schottky type on either side of said or each box.

Thus, said box(es) and the first junctions of the Schottky type are interdigitated so as to form with the first gate and the source, a diode of the JBS (acronym for Junction Barrier Schottky) type. Such a JBS diode allows reduction of $I_{GS}$ (current flowing between the first gate electrode and the source electrode) and an increase of $I_{DS}$ relatively to a p-n diode of the state of the art formed by the source, the gate and the second p-n junction.

Advantageously, each box has a doping level of the second type of conductivity suitable for forming an ohmic contact with the first gate electrode.

Such thereby formed ohmic contacts allow reduction in the electric field applied to each first junction of the Schottky type in order to reduce the risks of rapid degradation of each first junction of the Schottky type.

In an embodiment, the upper face of the first semiconducting region includes at least one box, of the second type of conductivity, laid out under the first portion of the second gate electrodes so as to delimit a second junction of the Schottky type on either side of said or each box.

Thus, the box(es) and the second junctions of the Schottky type are interdigitated so as to form with the second gate and the source, a diode of the JBS type. Such a JBS diode allows reduction of $I_{GS}$ (current flowing between the second gate electrode and the source electrode) and increase of $I_{DS}$ relatively to a p-n diode of the state of the art formed by the source, the gate and the second p-n junction.

Advantageously, each box has a doping level of the second type of conductivity suitable for forming an ohmic contact with the second gate electrode.

Such thereby formed ohmic contacts allow reduction in the electric field applied to each second junction of the Schottky type in order to reduce the risks of rapid degradation of each second junction of the Schottky type.

In an embodiment, the semiconducting structure includes a dielectric layer, preferably made in silica, laid out on the upper face of the first semiconducting region, and the second gate electrode has at least one second portion surmounting the dielectric layer.

Thus, the presence of a dielectric layer allows reduction in the leakage currents through said or each second portion of the second gate.

Advantageously, the contact area has a doping level of the first type of conductivity suitable for forming an ohmic contact with the source electrode.

Advantageously, the substrate has a doping level of the first type of conductivity suitable for forming an ohmic contact with the drain electrode.

Advantageously, the second semiconducting region has a doping level of the second type of conductivity suitable for forming an ohmic contact with the first gate electrode.

According to an embodiment, the second conduction channel extends along a second substantially vertical direction and the first conduction channel extends along a first direction substantially perpendicular to the second direction.

In an embodiment, the semiconducting structure includes at least one protection layer of the second type of conductivity laid out at the periphery of a junction between the first and the second semiconducting region, the protection layer having a doping level suitable for optimizing the voltage strength of the semiconducting structure.

Thus, the presence of such a layer gives the possibility of obtaining a peripheral protection of the JTE (acronym for Junction Termination Extension) type of a junction between the first and second semiconducting region.

Advantageously, the substrate, the first and the second semiconducting regions are made in a material selected from the group including silicon carbide, gallium nitride and diamond, and preferably silicon carbide.

Thus, such a semiconducting structure may be integrated in a monolithic way.

Further, as the semiconducting structure has to support operating voltages notably above 1,000 V, the materials of the group have to have a wide forbidden band, i.e. a forbidden band width of more than 1.7 eV.

The present invention also relates to an electronic power switch including a plurality of semiconducting structures according to the invention.

In an embodiment, the plurality of semiconducting structures is laid out so as to delimit at least one first substantially regular hexagonal pattern and/or at least one second pattern with interdigitated bands.

Advantageously, the electronic power switch includes a cell for protecting the first gate electrode substantially laid out at the center of each first pattern and/or laid out between two interdigitated bands of each second pattern.

Thus, with such an arrangement of the protection cells, it is possible to uniformize the protection of the first gate for a large size component forming an electronic power switch.

BRIEF DESCRIPTION OF THE DRAWINGS

Other features and advantages will become apparent in the description which follows of three embodiments of a semiconducting structure for an electronic power switch according to the invention, given as non-limiting examples, with reference to the appended drawings wherein.

DETAILED DESCRIPTION

For the different embodiments, the same references will be used for identical elements or ensuring the same functions, for the sake of simplification of the description.

Figure 1:
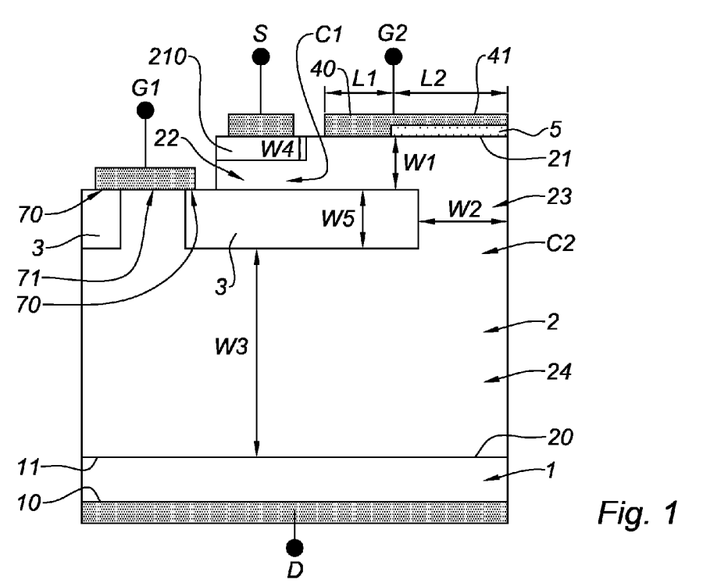
FIG. 1 is a schematic cross-sectional view of a semiconducting structure according to a first embodiment.

The semiconducting structure illustrated in FIG. 1 includes:

a substrate 1 of conductivity of the n type (i.e. electron conductor), having a lower face 10 and an upper face 11, a drain electrode D in contact with the lower face 10 of the substrate 1, a first semiconducting region 2, with conductivity of type n, having a lower surface 20 laid out on the upper face 11 of the substrate 1, and an upper surface 21 provided with a contact area 210, a source electrode S in contact with the contact area 210 of the first semiconducting region 2, a second semiconducting region 3 of conductivity of type p (i.e. whole conductor), laid out inside the first semiconducting region 2, under the contact area 210, so as to delimit a first lateral conduction channel C1 and a second vertical conduction channel C2 between the drain electrode D and the source electrode S. The first and second conduction channels C1, C2 are of conductivity of type n, a first metal gate electrode G1 having first portions 70 in contact with the second semiconducting region 3 and a second portion 71 in contact with the first semiconducting region 2 so as to form a first junction of the Schottky type.

a second metal gate electrode G2 having a first portion 40 in contact with the upper surface 21 of the first semiconducting region 2 so as to form a second junction of the Schottky type, the second gate electrode G2 being laid out at a distance from the contact area 210.

The substrate 1, for example of the wafer type, has a doping level of type n suitable for formic an ohmic contact with the drain electrode D. In this respect the substrate 1 has a resistivity preferably comprised between 0.015 and 0.03 ohm·cm.

The first semiconducting region 2 has a first semiconducting area 22 of conductivity of type n laid out above the second semiconducting region 3. The first semiconducting area 22 defines the height W1 of the first conduction channel C1. The height W1 of the first conduction channel C1 is of the order of 3 µm.

The first semiconducting region 2 has a second semiconducting area 23 of conductivity of type n laid out laterally to the second semiconducting region 3. The second semiconducting area 23 defines the width W2 of the second conducting channel C2. The width W2 of the second conduction channel C2 is of the order of 3 µm.

The first semiconducting region 2 has a third semiconducting area 24 with a conductivity of type n laid out below the second semiconducting region 3. The thickness W3 of the third semiconducting area 24 is of the order of 40 µm. The third semiconducting area 24 has a doping level of type n of the order of $10^{15}$ at·cm$^{-3}$ much lower than the doping level of type n of the first and the second semiconducting area 22, 23. Indeed, the doping level of type n of the first and of the second semiconducting area 22, 23 is of the order of $10^{16}$ at·cm$^{-3}$.

The contact area 210, with a conductivity of type n, is made at the upper surface 21 of the first semiconducting region 2. The contact area 210 has a doping level of type n suitable for forming an ohmic contact with the source electrode S. For this purpose, the contact area 210 has a doping level of type n of the order of $10^{19}$ at·cm$^{-3}$ much greater than the doping level of type n of the first and of the second semiconducting area 23, 24. The thickness W4 of the contact area 210 is of the order of 0.2 µm.

The second semiconducting region 3 has a doping level of type p suitable for forming an ohmic contact with the first gate electrode G1. For this purpose, the second semiconducting region 3 has a doping level of type p of the order of $10^{19}$ at·cm$^{-3}$ The thickness W5 of the second semiconducting region 3 is of the order of 0.5 µm.

The semiconducting structure further includes a dielectric layer 5, which may be made in silica, laid out on the upper face 21 of the first semiconducting region 2. The thickness of the dielectric layer 5 is of the order of 40 nm.

The second gate electrode G2 has a second portion 41 surmounting the dielectric layer 5. The second portion 41 of the second gate electrode G2 has a width L2 of the order of 5 µm. The first portion 40 of the second gate electrode G2 has a width L1 of the order of 5 µm.

The second portion 71 of the first gate electrode G1 in contact with the first semiconducting region 2 forms a first junction of the Schottky type, i.e. a metal/type n semiconductor junction.

The first portion 40 of the second gate electrode G2 in contact with the upper surface 21 of the first semiconducting region 2 forms a second junction of the Schottky type, i.e. a metal/type n semiconductor junction.

The first gate electrode G1, the source electrode S and the first junction of the Schottky type form a first diode of the Schottky type providing a unipolar current of majority carriers (electrons).

Also, the second gate electrode G2, the source electrode S and the second junction of the Schottky type form a second diode of the Schottky type providing a unipolar current of majority carriers (electrons).

Figure 4:
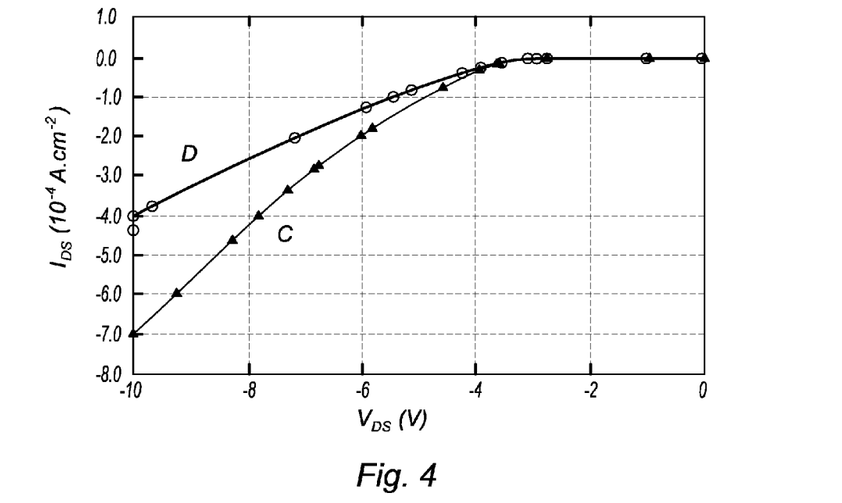
FIG. 4 is a graph illustrating $I_{DS}$, in surface density, versus $V_{DS}$ for a semiconducting structure according to the invention (curve C) and for a semiconducting structure of the state of the art (curve D)
Figure 5:
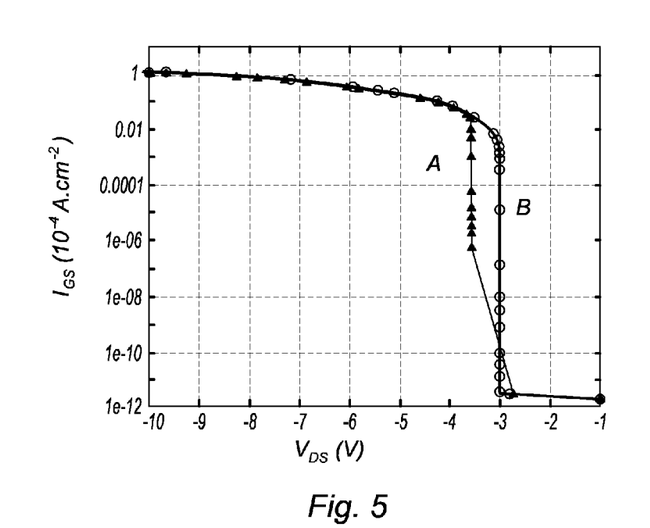
FIG. 5 is a graph representing $I_{GS}$, in surface density, versus $V_{DS}$ for a semiconducting structure according to the invention (curve A) and for a semiconducting structure of the state of the art (curve B)

As illustrated in FIGS. 4 and 5, when the bias voltage between the drain electrode D and the source electrode S, noted as $V_{DS}$, is negative, each aforementioned diode of the Schottky type gives the possibility, relatively to a diode of the p-n type of the state of the art, of:

reducing the current in absolute value flowing between the corresponding gate electrode and the source electrode S, noted as $I_{GS}$, (see curve A relatively to curve B of FIG. 5) in order to protect at best the corresponding gate electrode and the semiconducting structure, and increasing the current, in absolute value, flowing between the drain electrode D and the source electrode S, noted as $I_{DS}$, (see curve C relatively to curve D of FIG. 4) in order to improve the performances of the semiconducting structure in terms of electric conduction.

Additionally, the first diode of the Schottky type allows an increase in the starting voltage of the second gate electrode G2, in absolute value, i.e. the voltage for causing conduction of the second gate electrode G2 (see the curve A relatively to curve B of FIG. 5). In FIG. 5, as an example, the starting voltage has passed from −2.8V to −3.6V.

The substrate 1, the first and the second semiconducting region 2, 3 are made in silicon carbide. The substrate 1, the first and the second semiconducting region 2, 3 may also be made in gallium nitride or in diamond.

A method for manufacturing such a semiconducting structure includes the steps of:

a) providing the substrate 1, b) causing growth of the third semiconducting area 24 of the first semiconducting region 2 on the upper face 11 of the substrate 1, preferably by epitaxy, c) causing growth of the second semiconducting area 23 of the first semiconducting region 2 on the third semiconducting area 24, preferably by epitaxy, d) implanting, preferably by ion implantation, the second semiconducting region 3 inside the second semiconducting area 23, e) causing growth of the first semiconducting area 22 of the first semiconducting region 2 on the second semiconducting area 23, preferably by epitaxy, f) implanting, preferably by ion implantation, the contact area 210 inside the first semiconducting area 22, g) etching the upper portion of the first semiconducting area 22 until the second semiconducting region 3 is attained, h) depositing the dielectric layer 5 on the first semiconducting area 22, i) depositing a metallization layer on the lower face 10 of the substrate 1 so as to form the drain electrode D, j) depositing a metallization layer on the second semiconducting region 3 so as to form the first gate electrode G1, k) depositing a metallization layer on the contact area 210 so as to form the source electrode S, l) depositing a metallization layer on the first semiconducting area 22 and on the dielectric layer 5 so as to respectively form the first and the second portion 40, 41 of the second gate electrode G2.

Figure 2:
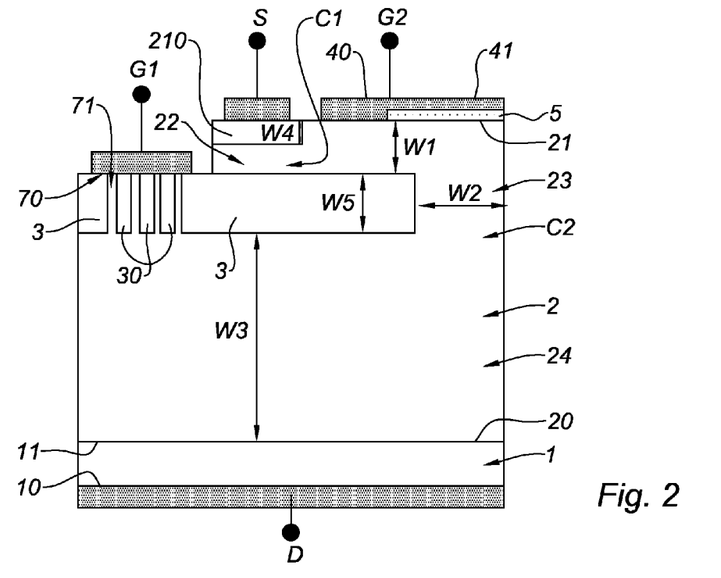
FIG. 2 is a schematic cross-sectional view of a semiconducting structure according to a second embodiment.

According to an embodiment illustrated in FIG. 2, the semiconducting structure differs from the semiconducting structure illustrated in FIG. 1 in that the second semiconducting region 3 includes a plurality of boxes 30, of conductivity of type p, laid out under the second portion 71 of the first gate electrode G1 so as to delimit a first junction of the Schottky type on either side of each box 30. Thus, such a plurality of boxes 30 delimits a plurality of first junctions of the Schottky type. The boxes 30 and the first junctions of the Schottky type are interdigitated so as to form with the first gate electrode G1 and the source electrode S, a diode of the JBS type. Such a JBS diode allows reduction of $I_{GS}$ and increase of $I_{DS}$ relatively to a diode of the p-n type of the state of the art. Further, the spacing between the boxes 30 determines the starting voltage of the second gate electrode G2.

Each box 30 has a doping level of type p suitable for forming an ohmic contact with the first gate electrode G1. For this purpose, each box 30 has a doping level of type p preferably comprised between $10^{19}$ at·cm$^{-3}$ and $4*10^{19}$ at·cm$^{-3}$.

Figure 3:
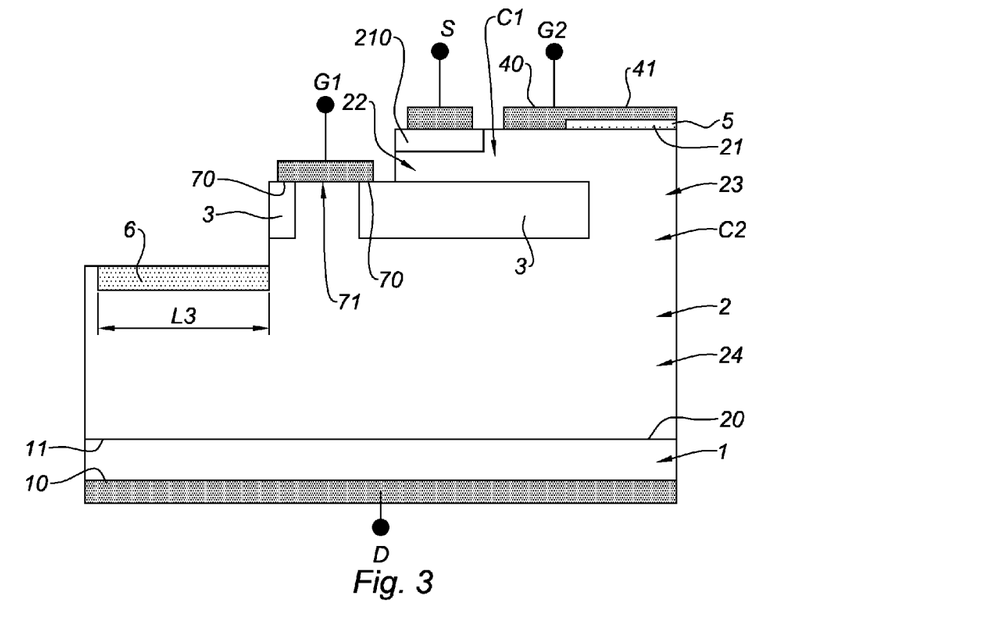
FIG. 3 is a schematic cross-sectional view of a semiconducting structure according to a third embodiment.

According to an embodiment illustrated in FIG. 3, the semiconducting structure differs from the semiconducting structure illustrated in FIG. 1 in that it includes a protection layer 6 of conductivity of type p.

The protection layer 6 is laid out at the periphery of the junction of the p-n type between the third semiconducting area 24 of the first semiconducting region 2 and the second semiconducting region 3. The length L3 of the protection layer 6 is of the order of 120 µm. The protection layer 6 has a doping level of type p suitable for optimizing the voltage strength of the semiconducting structure. To do this, the dose of dopants of type p is of the order of $10^{13}$ at·cm$^{-2}$.

Figure 6:
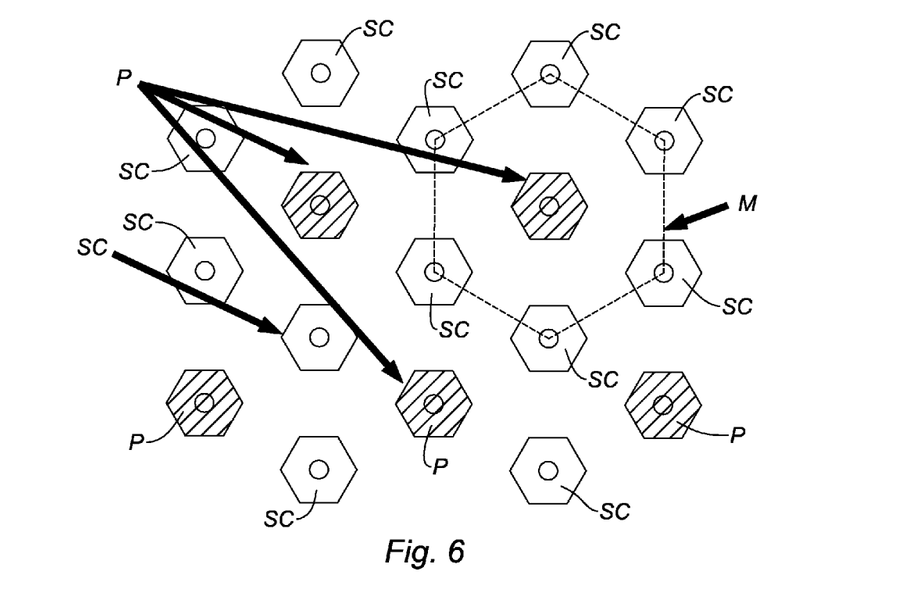
FIG. 6 is a schematic partial top view of an electronic power switch according to a first embodiment.

The electronic power switch schematized in FIG. 6 includes:
a plurality of semiconducting structures SC according to the invention laid out so as to delimit first substantially regular hexagonal patterns M of the honeycomb type,
a protection cell P of the first gate electrode G1 (not shown) substantially laid out at the center of each first pattern M.

Figure 7:
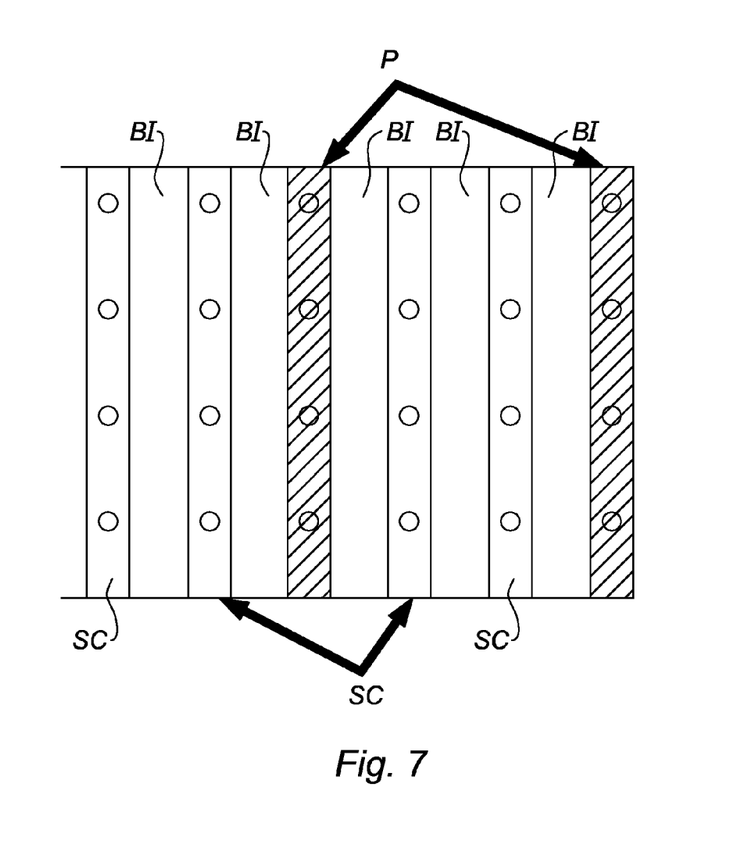
FIG. 7 is a schematic partial top view of an electronic power switch according to a second embodiment.

The electronic power switch schematized in FIG. 7 differs from the electronic power switch schematized in FIG. 6, in that:
the plurality of semiconducting structures SC is laid out so as to delimit second patterns in interdigitated bands BI,
a protection cell P is laid out between two interdigitated bands BI of each second pattern.

Of course, the embodiments of the invention described above do not have any limiting nature. Details and improvements may be brought thereto in other alternative embodiments without however departing from the scope of the invention.

The invention claimed is:

1. A semiconducting structure for an electronic power switch, including:
   a substrate of a first type of conductivity, having a lower face and an upper face,
   a drain electrode in contact with the lower face of the substrate,
   a first semiconducting region, of the first type of conductivity, having a lower surface laid out on the upper face of the substrate and an upper surface provided with a contact area,
   a source electrode in contact with the contact area of the first semiconducting region,
   a second semiconducting region, of a second type of conductivity, laid out inside the first semiconducting region, under the contact area, so as to delimit a first and a second conduction channel of the first type of conductivity between the drain electrode and the source electrode,
   the semiconducting structure being wherein it includes:
   a first metal gate electrode having at least one first portion in contact with the second semiconducting region, and at least one second portion in contact with the first semiconducting region so as to form a first junction of the Schottky type, and
   a second metal gate electrode having at least one first portion in contact with the upper surface of the first semiconducting region so as to form a second junction of the Schottky type, the second gate electrode being laid out at a distance from the contact area,
   wherein the first metal gate electrode is buried and the second metal gate electrode is not buried.

2. The semiconducting structure according to claim 1, wherein the second semiconducting region includes at least one box, of the second type of conductivity, laid out under the second portion of the first gate electrode so as to delimit a first junction of the Schottky type on either side of said or each box.

3. The semiconducting structure according to claim 2, wherein each box has a doping level of the second type of conductivity, suitable for forming an ohmic contact with the first gate electrode.

4. The semiconducting structure according to claim 1, wherein the upper face of the first semiconducting region includes at least one box, of the second type of conductivity, laid out under the first portion of the second gate electrode so as to delimit a second junction of the Schottky type on either side of said or each box.

5. The semiconducting structure according to claim 4, wherein each box has a doping level of the second type of conductivity suitable for forming an ohmic contact with the second gate electrode.

6. The semiconducting structure according to claim 1, further comprising a dielectric layer, made in silica, laid out on the upper face of the first semiconducting region, and wherein the second gate electrode has at least one second portion surmounting the dielectric layer.

7. The semiconducting structure according to claim 1, wherein the contact area has a doping level of the first type of conductivity suitable for forming an ohmic contact with the source electrode.

8. The semiconducting structure according to claim 1, wherein the substrate has a doping level of the first type of conductivity suitable for forming an ohmic contact with the drain electrode.

9. The semiconducting structure according to claim 1, wherein the second semiconducting region has a doping level of the second type of conductivity suitable for forming an ohmic contact with the first gate electrode.

10. The semiconducting structure according to claim 1, wherein the second conduction channel extends along a second substantially vertical direction and the first conduction channel extends along a first direction substantially perpendicular to the second direction.

11. The semiconducting structure according to claim 1, further comprising at least one protection layer of the second type of conductivity laid out at the periphery of a junction between the first and the second semiconducting region, the protection layer having a doping level suitable for optimizing the voltage strength of the semiconducting structure.

12. The semiconducting structure according to claim 1, wherein the substrate, the first and the second semiconducting region are made in a material comprising at least one of silicon carbide, gallium nitride and diamond, and silicon carbide.

13. An electronic power switch, comprising a plurality of semiconducting structures according to claim 1.

14. The electronic power switch according to claim 13, wherein the plurality of semiconducting structures is laid out so as to delimit at least one first substantially regular hexagonal pattern and/or at least one second interdigitated band pattern.

15. The electronic power switch according to claim 14, further comprising a protection cell of the first gate electrode substantially laid out at the center of each first pattern and/or laid out between two interdigitated bands of each second pattern.

* * * * *